(12) United States Patent
North et al.

(10) Patent No.: US 9,575,521 B1
(45) Date of Patent: Feb. 21, 2017

(54) CHASSIS EXTERNAL WALL LIQUID COOLING SYSTEM

(71) Applicant: Dell Products L.P., Round Rock, TX (US)

(72) Inventors: Travis Christian North, Cedar Park, TX (US); David Michael Meyers, Round Rock, TX (US); Shawn Paul Hoss, Round Rock, TX (US); Austin Michael Shelnutt, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 7 days.

(21) Appl. No.: 14/814,269

(22) Filed: Jul. 30, 2015

(51) Int. Cl.
*G06F 1/16* (2006.01)
*G06F 1/20* (2006.01)

(52) U.S. Cl.
CPC ........................................ *G06F 1/20* (2013.01)

(58) Field of Classification Search
CPC ......... H05K 7/20345; G06F 1/20; G06F 1/183
USPC ........... 165/104.33, 121, 10, 104.14, 104.31, 165/80.4, 104.13, 98; 362/23.13, 606, 362/608, 609; 361/697, 679.46, 679.47, 361/679.53, 679.21, 679.52, 679.33, 361/679.31, 679.02, 679.48, 679.32, 361/679.58, 679.01, 679.26, 679.59, 361/679.08, 679.09; 345/207, 504, 156, 345/168, 82, 102, 905; 455/575.1, 344; 312/223.2, 312/111, 223.1, 236, 237, 300, 312/42, 333
See application file for complete search history.

(56) References Cited

U.S. PATENT DOCUMENTS 7,403,383 B2 * 7/2008 McGuff .................... G06F 1/20
165/121
7,405,935 B1 * 7/2008 Carey ................ H05K 7/20345
165/104.33

* cited by examiner

*Primary Examiner* — Hung Duong
(74) *Attorney, Agent, or Firm* — Haynes and Boone, LLP

(57) ABSTRACT

An external chassis wall liquid cooling system includes a chassis defining a chassis housing. A chassis wall is located on the chassis and includes a first surface that is located adjacent the chassis housing and a second surface that is located opposite the chassis wall from the first surface and that provides an outer surface of the chassis. A liquid cooling channel is defined by the chassis wall and extends through the chassis wall between the first surface and the second surface. A liquid is located in the liquid cooling channel, and a pump is coupled to the liquid cooling channel and configured to move the liquid through the liquid cooling channel. A fan system in the chassis housing may move air past heat producing components to transfer heat produced by those heat producing components, and the liquid may further dissipate that heat out of the chassis.

20 Claims, 15 Drawing Sheets

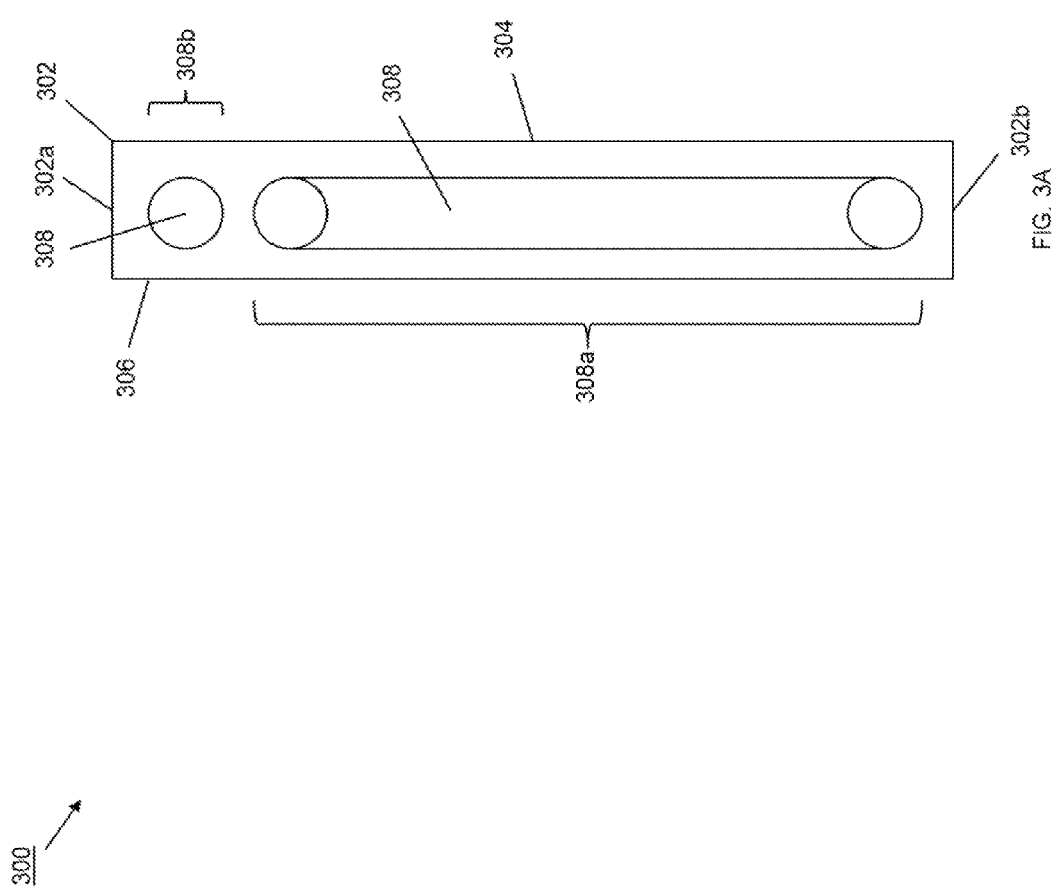

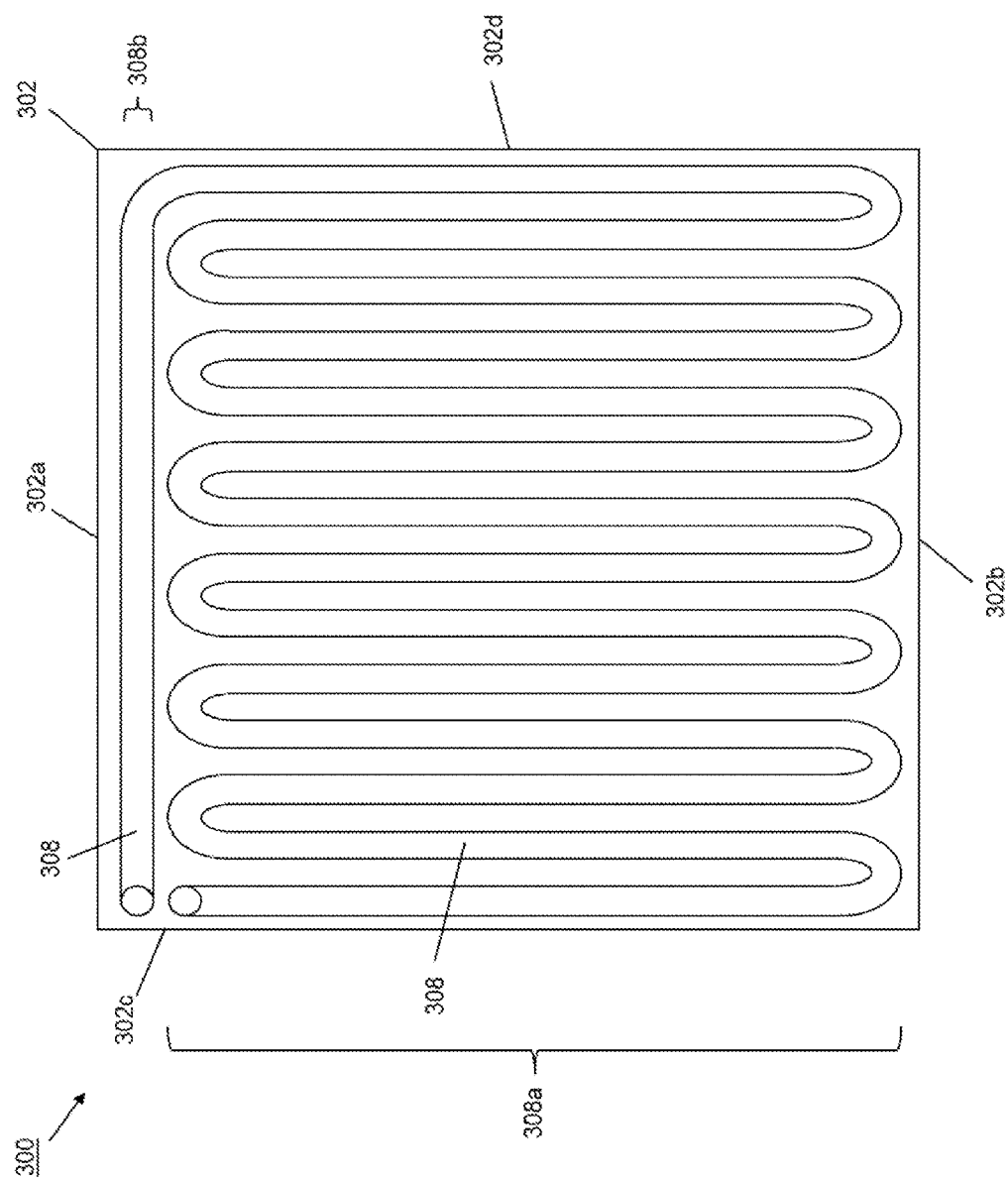

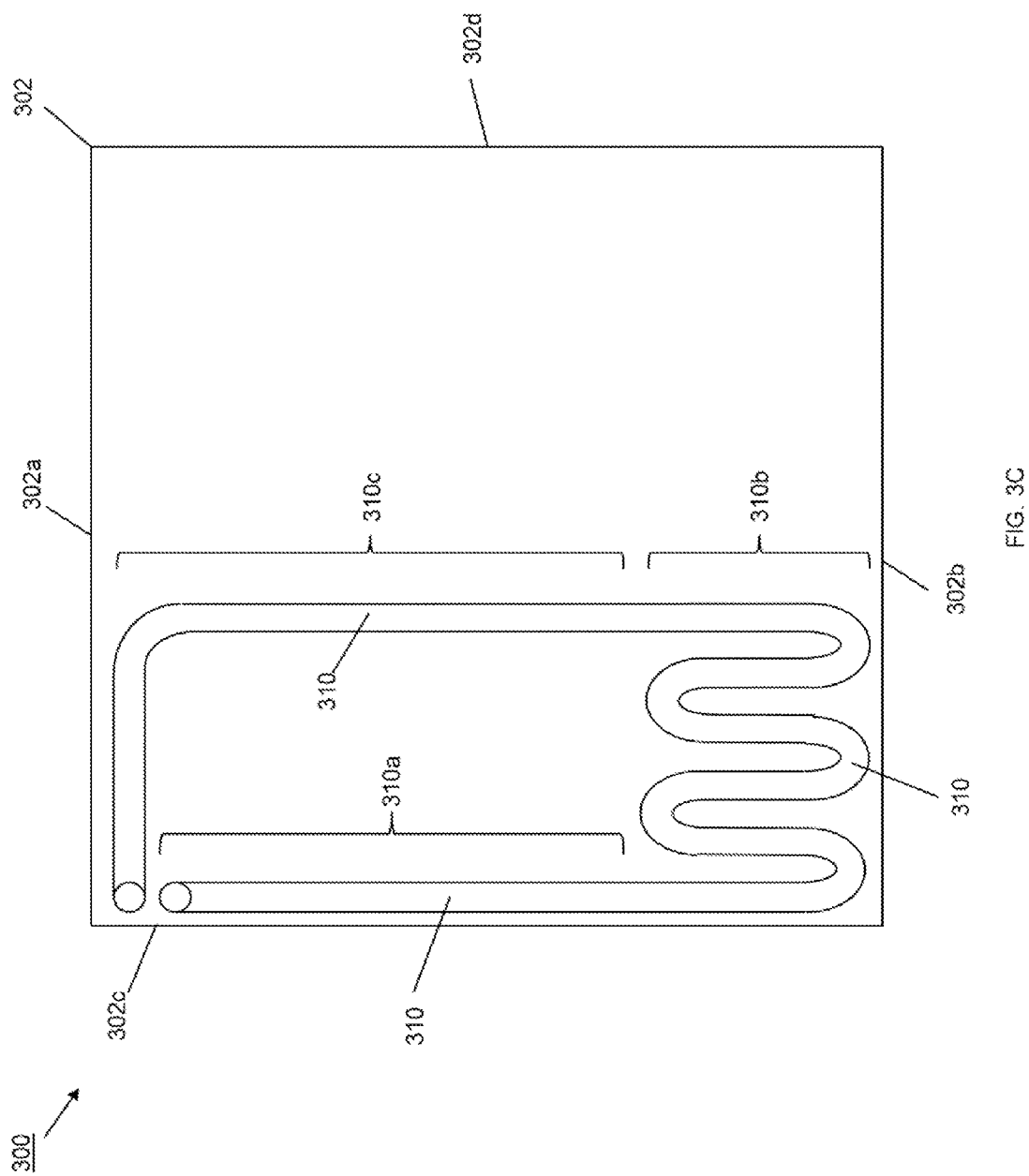

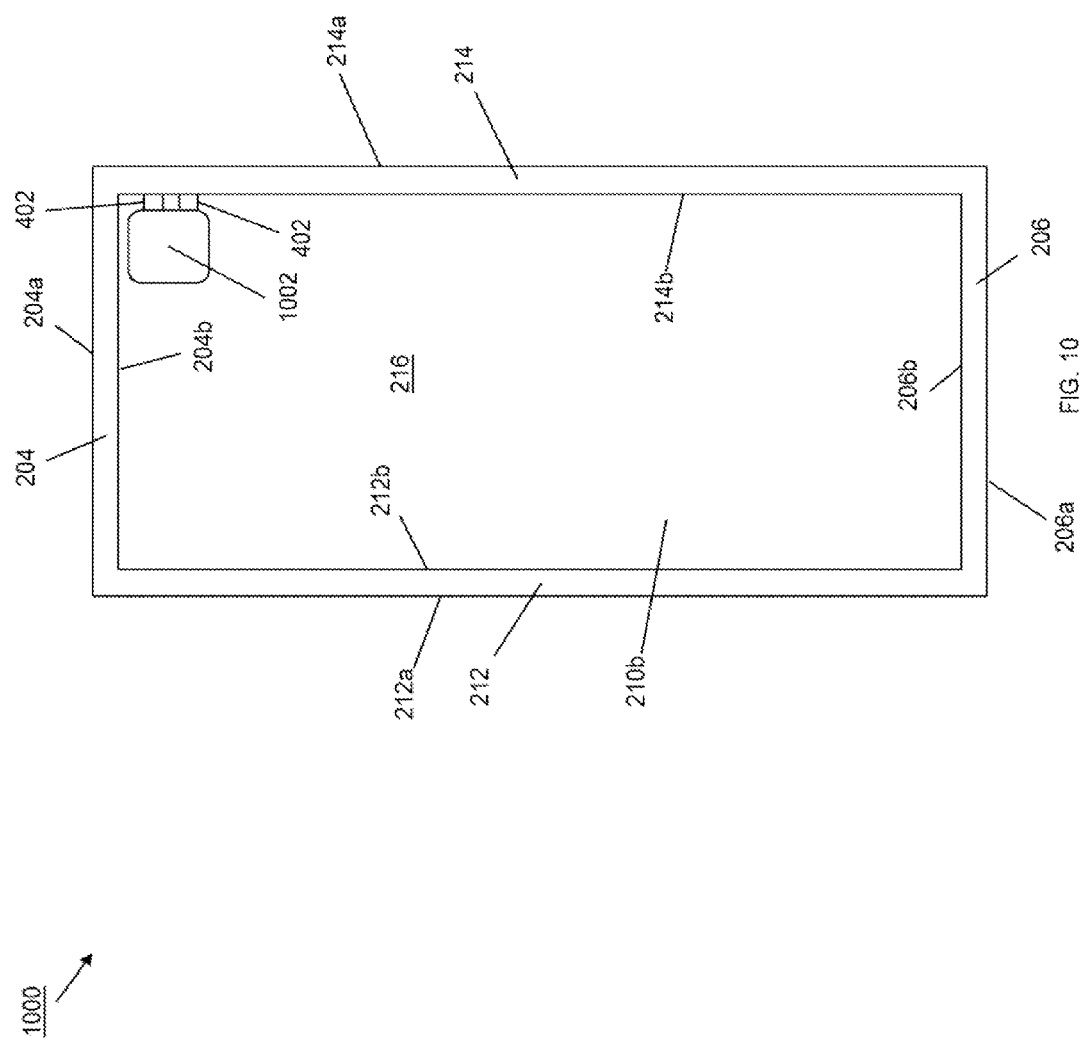

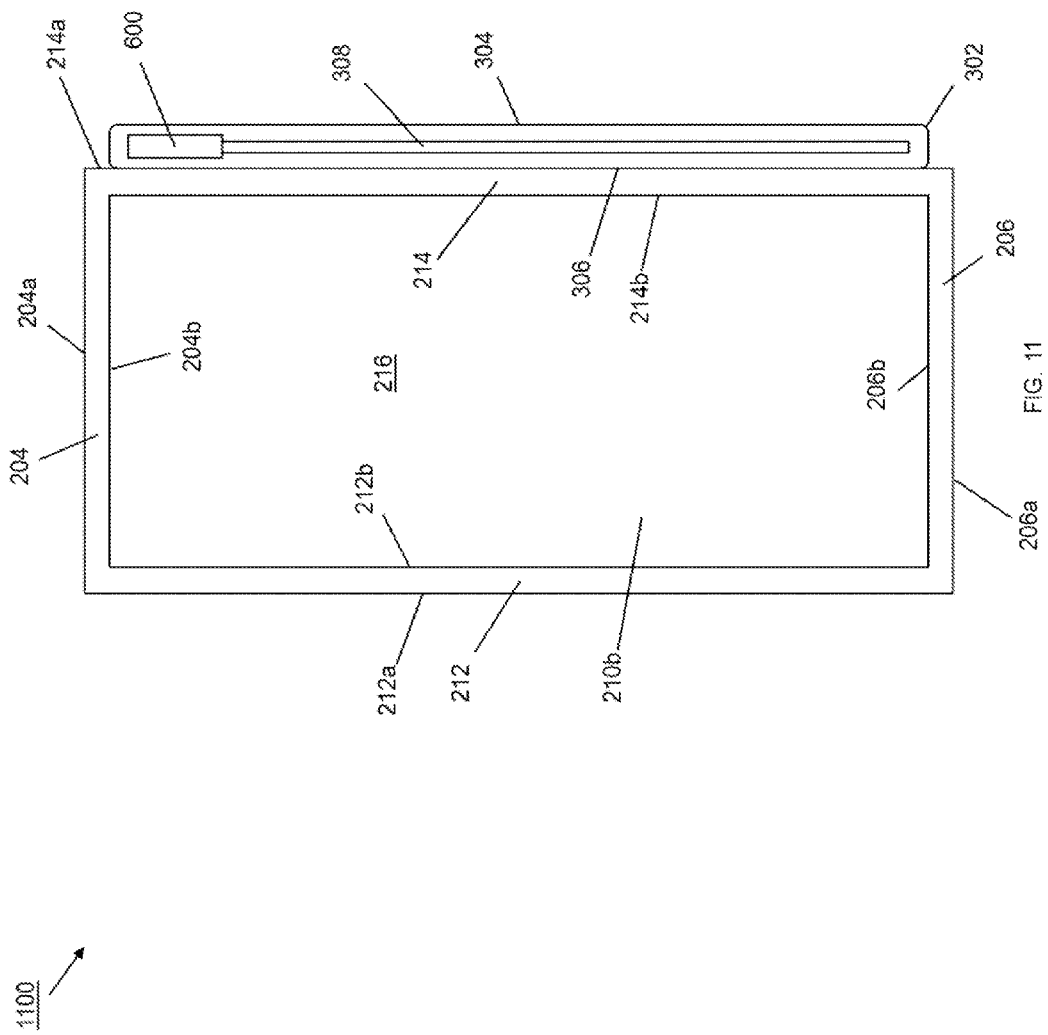

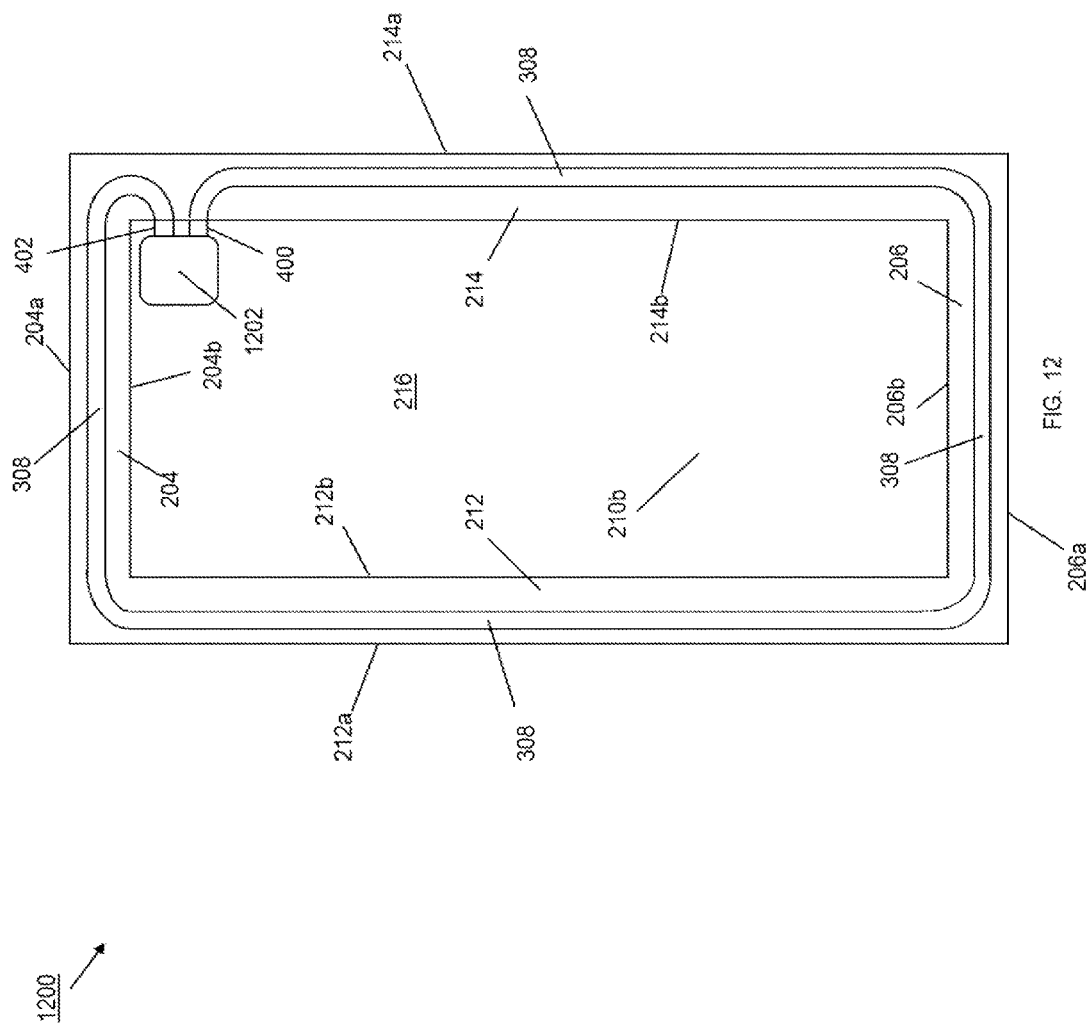

CHASSIS EXTERNAL WALL LIQUID COOLING SYSTEM

BACKGROUND

The present disclosure relates generally to information handling systems, and more particularly to a liquid cooling system provided in at least one external wall of an information handling system chassis.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As information handling systems such as, for example, desktop computing systems, become faster and more powerful, the computing components (e.g., processing systems, memory systems, video cards, etc.) utilized in those computing systems generate more and more heat that must be dissipated. In some situations, the use of liquid cooling systems becomes desirable to dissipate that heat. For example, a liquid (e.g., water-based, coolant-based, and/or other liquids knows in the art) may be provided in a conventional liquid cooling system that is provided in a housing of a computer system chassis and configured to move that liquid through liquid conduits such that the liquid flows by heat producing components that heat up the liquid, as well as by air cooling systems (e.g., fans operated to move air by the liquid conduits) to cool that liquid moving through the liquid conduit and dissipate the heat generated by the heat producing components. However, liquid cooling systems tend to occupy relatively large amount of space within the housing of the computing system chassis, which can conflict with the competing desire to make computing systems as small as possible. For example, some high powered desktop computing systems have begun to generate upward of 1000 watts that must be dissipated by the chassis cooling system, which would require significant increases in chassis size and volume if such heat production is to be dissipated using conventional air cooling and/or air/liquid cooling systems located within the housing of the computing system chassis.

Accordingly, it would be desirable to provide an improved liquid cooling system.

SUMMARY

According to one embodiment, an information handling system (IHS) includes a chassis defining a chassis housing; a processing system located in the chassis housing; a memory system located in the chassis housing and coupled to the processing system; a fan located in the chassis housing and configured to provide an airflow through the chassis housing and adjacent the processing system; a chassis wall located on the chassis and including a first surface that is located adjacent the chassis housing and a second surface that is located opposite the chassis wall from the first surface and that provides an outer surface of the chassis; and a liquid cooling channel defined by the chassis wall and extending through the chassis wall between the first surface and the second surface.

BRIEF DESCRIPTION OF THE DRAWINGS

FIG. 3A is a cut-away view illustrating an embodiment of a chassis wall that may be provided with the chassis of FIGS. 2A and 2B.

FIG. 3B is a cut-away view illustrating an embodiment of the chassis wall of FIG. 3A.

FIG. 3C is a cut-away view illustrating an embodiment of a chassis wall that may be provided with the chassis of FIGS. 2A and 2B.

FIG. 10 is a cut-away view illustrating an embodiment of the chassis wall of FIG. 3 provided in the chassis of FIGS. 2A and 2B.

FIG. 11 is a cut-away view illustrating an embodiment of the chassis wall of FIG. 6 provided with the chassis of FIGS. 2A and 2B.

FIG. 12 is a cut-away view illustrating an embodiment of a plurality of the chassis walls of FIG. 3 provided in the chassis of FIGS. 2A and 2B.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
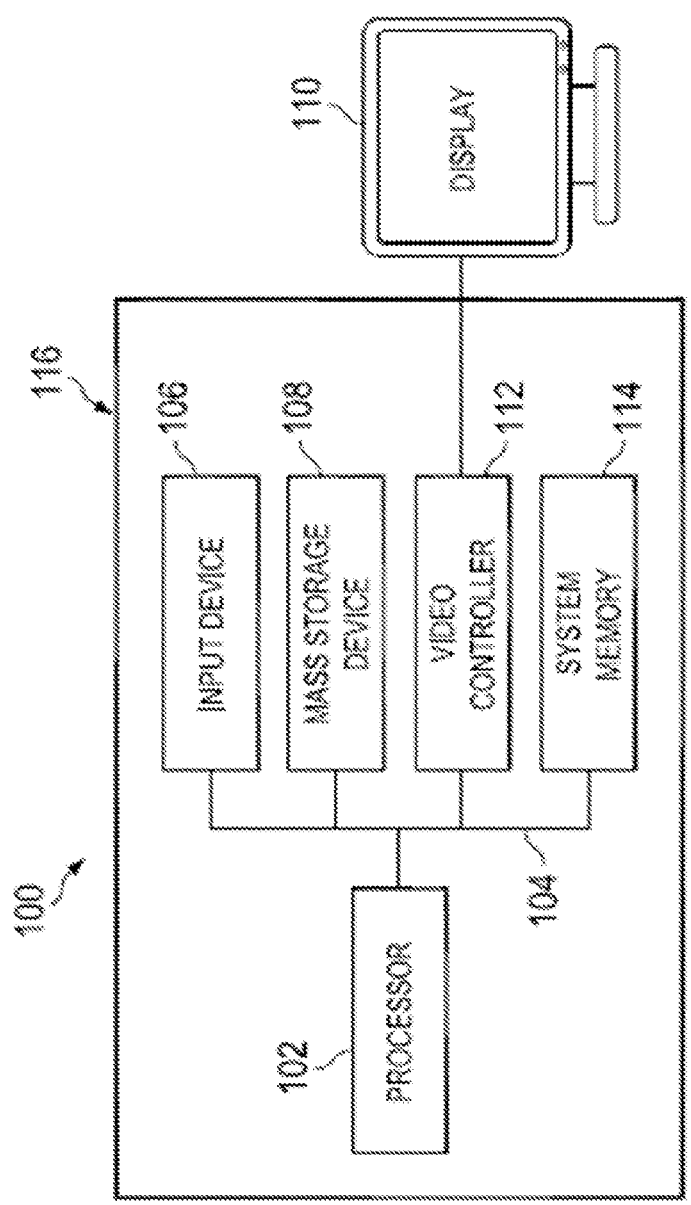
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, trackpads, microphones and/or other voice input systems, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
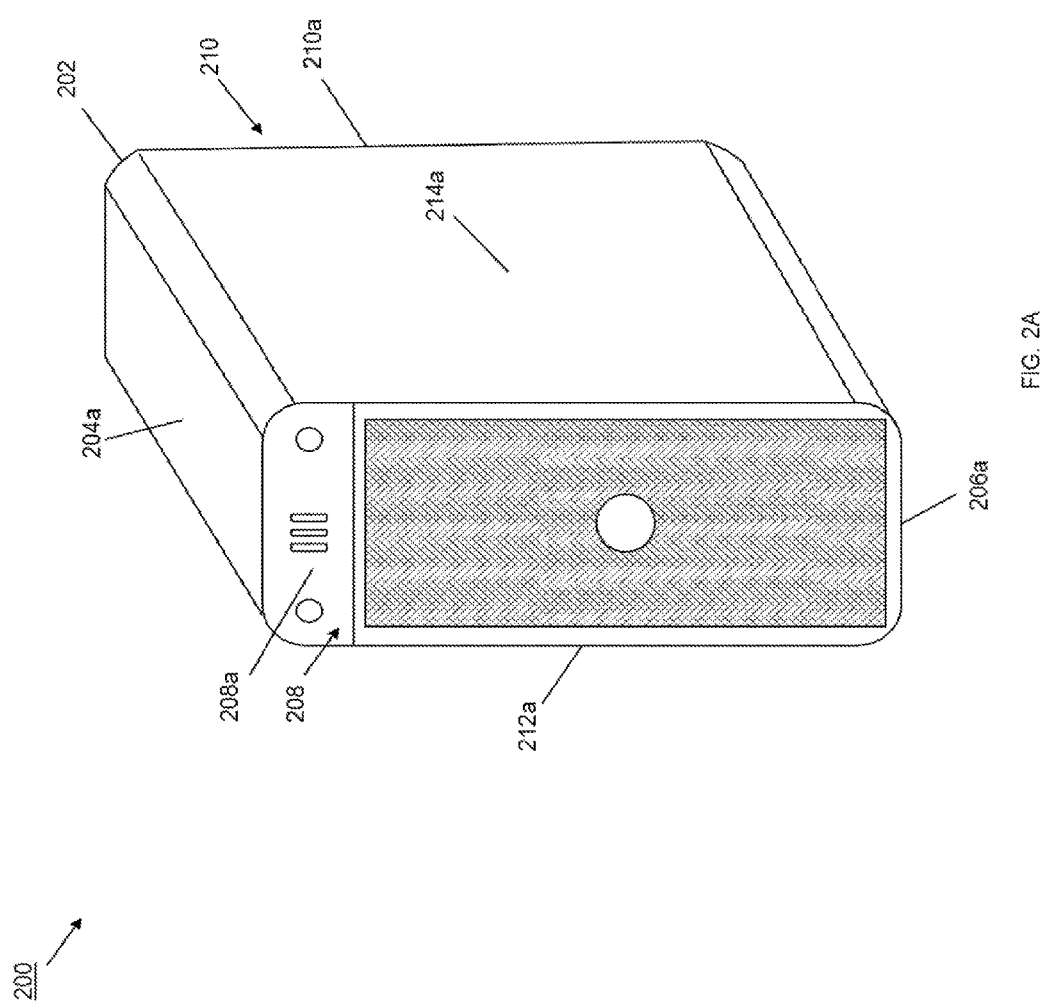
FIG. 2A is a perspective view illustrating an embodiment of a chassis.
Figure 2B:
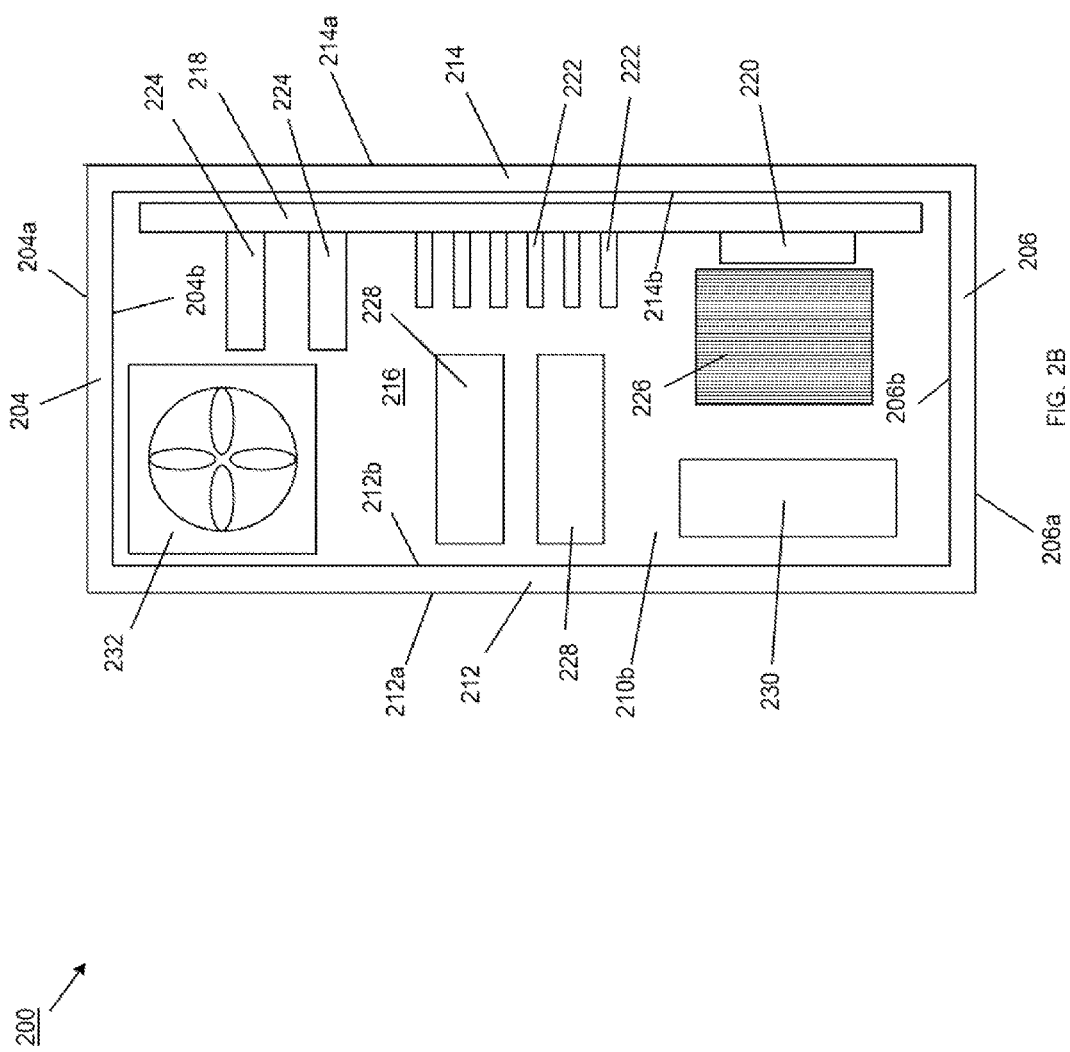
FIG. 2B is a cut-away view illustrating an embodiment of the chassis of FIG. 2A.

Referring now to FIGS. 2A and 2B, an embodiment of a chassis 200 is illustrated. In an embodiment, the chassis 200 may be the chassis 116 discussed above with reference to the IHS 100 in FIG. 1, and as such may house some or all of the components of the IHS 100. In the illustrated embodiment, the chassis 200 is a desktop/tower chassis. However, in other embodiments, the features of the chassis 200 discussed below may be provided for other types of computing systems including, for example, laptop/notebook computers, tablet computers, mobile phones, servers, switches, storage systems, and/or other computing system known in the art. The chassis 200 includes a base 202 having a top wall 204, a bottom wall 206 that is located opposite the base 202 from the top wall 204, a front wall 208 extending between the top wall 204 and the bottom wall 206, a rear wall 210 extending between the top wall 204 and the bottom wall 206 and located opposite the base 202 from the front wall 208, and a pair of side walls 212 and 214 extending between the top wall 204, the bottom wall 206, the front wall 208, and the rear wall 210 and located opposite the base 202 from each other. The top wall 204 provides a top outer surface 204a and a top inner surface 204b of the chassis 200, the bottom wall 206 provides a bottom outer surface 206a and a bottom inner surface 206b of the chassis 200, the front wall 208 provides a front outer surface 208a and a front inner surface (not illustrated, but located opposite the front wall 208 from the front outer surface 208a) of the chassis 200, the rear wall 210 provides a rear outer surface 210a and a rear inner surface 210b of the chassis 200, the side wall 212 provides a side outer surface 212a and a side inner surface 212b of the chassis 200, and the side wall 214 provides a side outer surface 214a and a side inner surface 214b of the chassis 200.

The chassis 200 defines a chassis housing 216 between the top inner surface 204b, the bottom inner surface 206b, the front inner surface, the rear inner surface 210b, and the side inner surfaces 212b and 214b. As discussed above, any of a variety of IHS components may be located in the chassis housing 216. For example, as illustrated in FIG. 2B, a circuit board 218 (e.g., a motherboard) is located in the chassis housing 216 and positioned adjacent the side wall 214. While illustrated as separated from the side wall 214 for clarity, in some embodiments, the circuit board 218 may engage the side inner surface 214b of the side wall 214 to optimize heat transfer to the chassis wall 214 as discussed below. In the illustrated embodiment, a processor 220, a plurality of memory devices 222, and a plurality of subsystem cards 224 (e.g., a video card, a network interface controller (NIC), etc.) are mounted to the circuit board 218. A heat dissipation device 226 (e.g., a heat sink) is coupled to the processor 220. A plurality of storage devices 228 are positioned in the chassis housing 216 and may be coupled to the circuit board 218 via cabling (not illustrated) and/or other coupling methods known in the art. A fan 230 is positioned in the chassis housing 216 such that it is directed toward the heat dissipation device 226 and configured to provide an air flow to the heat dissipation device 226, and a fan 232 is positioned in the chassis housing 216 and configured to provide an airflow through the chassis housing 216 and, in some embodiment, out of the chassis 200. Each of the fans 230 and 232 may be coupled to the circuit board 218 via cabling (not illustrated) and/or other coupling methods known in the art. As illustrated in FIG. 2A, venting and/or other airflow apertures are defined by the front wall 208 to allow for airflow through the front wall 208 and into/out of the chassis housing 216. Similar venting and/or airflow apertures may be provided in the other walls of the chassis 200 while remaining within the scope of the present disclosure. While specific structure and components for the chassis 200 are illustrated in FIGS. 2A and 2B and described below, one of skill in the art in possession of the present disclosure will recognize that a wide variety of other structures and components will fall within the scope of the present disclosure.

Referring now to FIGS. 3A and 3B, an embodiment of a chassis wall 300 is illustrated. In the embodiments discussed below, the chassis wall 300 is described as being the side wall 214 of the chassis 200 discussed above with reference to FIGS. 2A and 2B. However, the teachings of the chassis wall 300 may be incorporated into any of the walls of the chassis 200 while remaining within the scope of the present disclosure. The chassis wall 300 includes a base 302 having a top edge 302a, a bottom edge 302b located opposite the base 302 from the top edge 302a, a front edge 302c extending between the top edge 302a and the bottom edge 302b, and a rear edge 302d extending between the top edge 302a and the bottom edge 302b and located opposite the base 302 from the front edge 302c. An outer surface 304 (which may be the side outer surface 214a of the chassis 200) of the base 302 extends between the top edge 302a, the bottom edge 302b, the front edge 302c, and the rear edge 302d. An inner surface 306 (which may be the side inner surface 214b of the chassis 200) of the base 302 extends between the top edge 302a, the bottom edge 302b, the front edge 302c, and the rear edge 302d and is located opposite the base 302 from the outer surface 304. In the illustrated embodiment, the base 302 defines a liquid cooling channel 308 between the top edge 302a, the bottom edge 302b, the front edge 302c, the rear edge 302d, the outer surface 304, and the inner surface 306. However, as discussed below, the liquid cooling channel 308 may extend through any of the edges on the chassis wall 300 to couple to other liquid cooling channels defined by other walls in the chassis 200. In different embodiments, the base 302 of the chassis wall 300 may be fabricated from an Acrylonitrile Butadiene Styrene (ABS) material or other polymers known in the art, polycarbonate materials, carbon fiber materials, aluminum materials, copper materials, magnesium materials, combinations thereof, and/or a variety of other materials known in the art. Furthermore, a variety of attachment and/or coupling features may be provided on the base 302 of the chassis wall 300 and used to couple the chassis wall 300 to the chassis 200 while remaining within the scope of the present disclosure.

In the embodiment illustrated in FIGS. 3A and 3B, the liquid cooling channel 308 provides a substantially uniform liquid cooling channel that is distributed throughout the chassis wall 300 and that includes a cooling section 308a and a return section 308b. As would be understood by one of skill in the art in possession of the present disclosure, and as discussed in further detail below, a liquid may be moved by a liquid moving system (e.g., a pump) through the cooling section 308a of the liquid cooling channel 308 to dissipate heat generated within the chassis housing 216, and then may be returned to the liquid moving system through the return section 308b of the liquid cooling channel 308 (while still dissipating heat generated within the chassis housing 216). However, while the liquid cooling channel 308 is illustrated and described as a substantially uniform liquid cooling channel distributed across the entire chassis wall 300, other configurations of the liquid cooling channel are envisioned as falling within the scope of the present disclosure.

For example, FIG. 3C illustrates a liquid cooling channel 310 defined by the chassis wall 300 in substantially the same manner as discussed above, but with a supply section 310a, a cooling section 310b, and a return section 310c. Similarly as with the liquid cooling channel 308, a liquid may be moved by a liquid moving system (e.g., a pump) through the supply section 310a of the liquid cooling channel 308 (while dissipating heat generated within the chassis housing 216), through the cooling section 310b to dissipate heat generated from one or more specific components within the chassis housing 216, and then may be returned to the liquid moving system through the return section 310c of the liquid cooling channel 308 (while still dissipating heat generated within the chassis housing 216). Cooling sections such as the cooling section 310c of the liquid cooling channel 310 may be positioned in the chassis wall 300 adjacent one or more particular components in the chassis 200 that required heat dissipation using the external chassis wall liquid cooling system. For example, the cooling section 310c of the liquid cooling channel 310 in FIG. 3C may be positioned adjacent the processor 220 and configured to specifically dissipate heat from that processor 220 (e.g., via engagement of the chassis wall 300 with the circuit board 218 such that the cooling section 310c of the liquid cooling channel 310 is immediately adjacent the portion of the circuit board 218 that mounts to the processor 220). One of skill in the art in possession of the present disclosure will recognize how cooling sections of liquid cooling channels defined by the chassis wall 300 may be configured similarly to the cooling section 310c to focus the cooling of the liquid cooling channel on particular heat producing components that require the higher levels of heat dissipation enabled by the liquid cooling channel 310 (e.g., the memory devices 222, the cards 224, etc.). Furthermore, the liquid cooling channel in the chassis wall 300 may have a variety of other configurations known in the art while remaining within the scope of the present disclosure. For example, liquid may enter the liquid cooling channel in the chassis wall along the top edge 302a (e.g., distributed across the length of the top edge), may move through the chassis wall via the force of gravity, may exit the liquid cooling channel in the chassis wall along the bottom edge 302b (e.g., distributed across the length of the bottom edge), and may then be circulated back up to the top edge 302a of the chassis wall to repeat the process.

Figure 4:
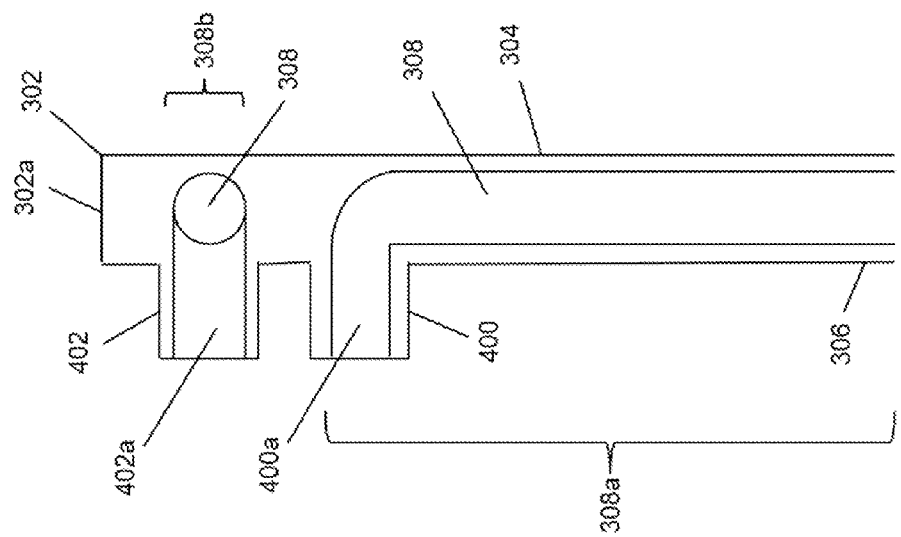
FIG. 4 is a cut-away view illustrating an embodiment of the chassis wall of FIG. 3.

Referring now to FIG. 4, an embodiment of the chassis wall 300 of FIG. 3 is illustrated. In the illustrated embodiment, the chassis wall 300 includes an inlet 400 that extends from the inner surface 306 of the chassis wall 300 and defines an inlet channel 400a that extends from the cooling section 308a of the liquid cooling channel 308. The chassis wall 300 also includes an outlet 402 that extends from the inner surface 306 of the chassis wall 300 spaced apart from and adjacent to the inlet 402, and defines an outlet channel 402a that extends from the return section 308b of the liquid cooling channel 308. While the terms "inlet", "outlet", "supply" and "return" have been used above, one of skill in the art in possession of the present disclosure will recognize the flow of the liquid through the liquid cooling channel 308 may be reversed such that the use of those terms is reversed as well (i.e., the "outlet" becomes the "inlet", and the "inlet" becomes the "outlet", the "return" section becomes the "supply section", and so on). As discussed below, the inlet 400 and the outlet 402 may be coupled to a liquid moving system (e.g., pump and/or reservoir) that is located in the chassis housing 216 in order to provide for the movement of liquid through the liquid cooling channel 308. While a specific location of the inlet 400 and the outlet 402 is illustrated and described in FIG. 4 (i.e., adjacent each other and the top edge 302a of the chassis wall 300), the inlet 400 and the outlet 402 may extend from any location on the inner surface 306 (and in some embodiments, from the outer surface 308) of the chassis wall 300 and at different distances from each other while remaining within the scope of the present disclosure.

Figure 5:
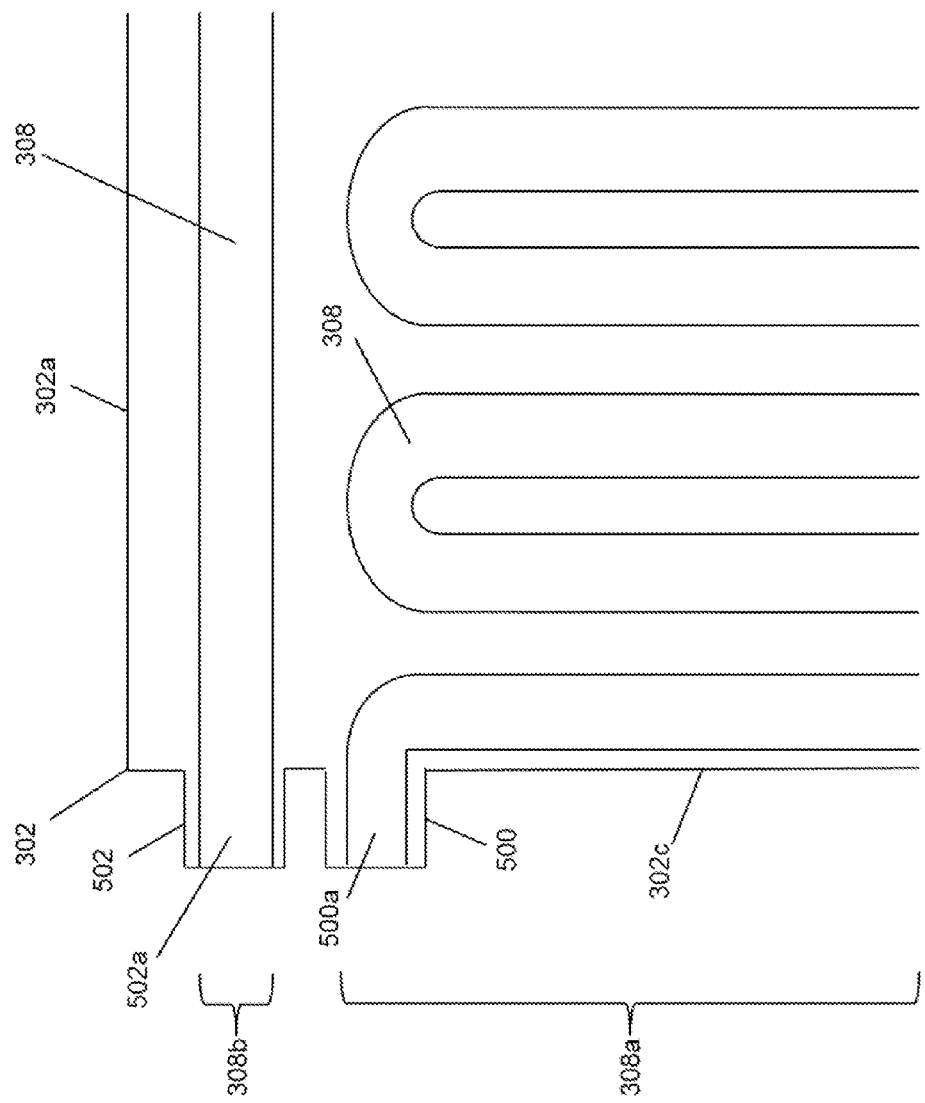
FIG. 5 is a cut-away view illustrating an embodiment of the chassis wall of FIG. 3.

Referring now to FIG. 5, an embodiment of the chassis wall 300 of FIG. 3 is illustrated. In the illustrated embodiment, the chassis wall 300 includes an inlet 500 that extends from the front edge 302c of the chassis wall 300 and defines an inlet channel 500a that extends from the cooling section 308a of the liquid cooling channel 308. The chassis wall 300 also includes an outlet 502 that extends from the front edge 302c of the chassis wall 300 spaced apart form and adjacent to the inlet 502, and defines an outlet channel 502a that extends from the return section 308b of the liquid cooling channel 308. Similarly as discussed above, while the terms "inlet", "outlet", "supply" and "return" have been used above, one of skill in the art in possession of the present disclosure will recognize the flow of the liquid through the liquid cooling channel 308 may be reversed such that the use of those terms is reversed as well (i.e., the "outlet" becomes the "inlet", and the "inlet" becomes the "outlet", the "return" section becomes the "supply section", and so on). As discussed below, the inlet 500 and the outlet 502 may be coupled to another chassis wall on the chassis 200 (e.g., that includes a liquid cooling channel similar to the liquid cooling channel 308), and/or to a liquid moving system (e.g., pump and/or reservoir) that is located in the chassis housing 216 or the other chassis wall in order to provide for the movement of liquid through the liquid cooling channel 308. While a specific location of the inlet 500 and the outlet 502 is illustrated and described in FIG. 5 (i.e., adjacent each other and the top edge 302a of the chassis wall 300), the inlet 500 and the outlet 502 may extend from any location on the front edge 302c (and in other embodiments, from the top edge 302a, the bottom edge 302b, and/or the rear edge 302d) of the chassis wall 300 and at different distances from each other while remaining within the scope of the present disclosure.

Figure 6:
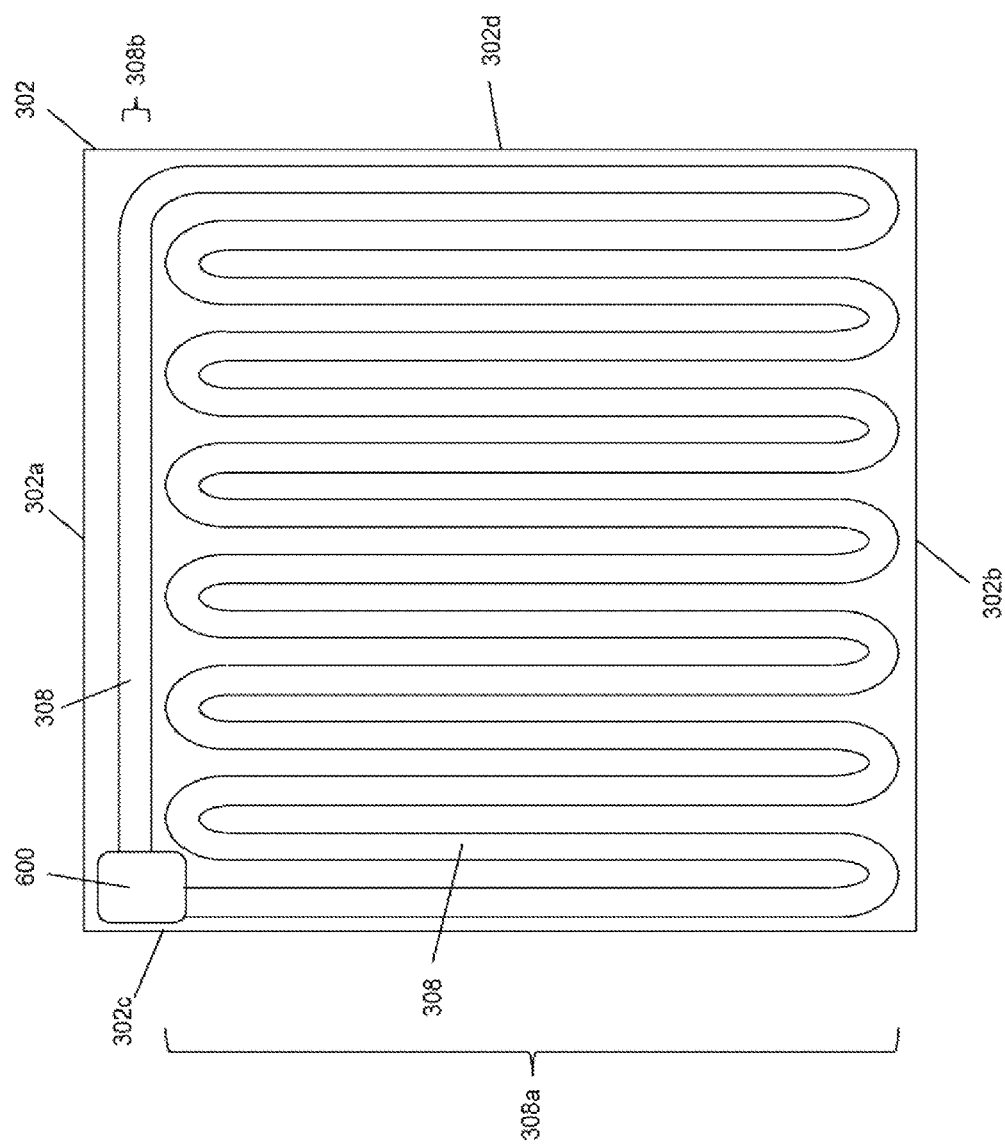
FIG. 6 is a cut-away view illustrating an embodiment of the chassis wall of FIG. 3.
Figure 7:
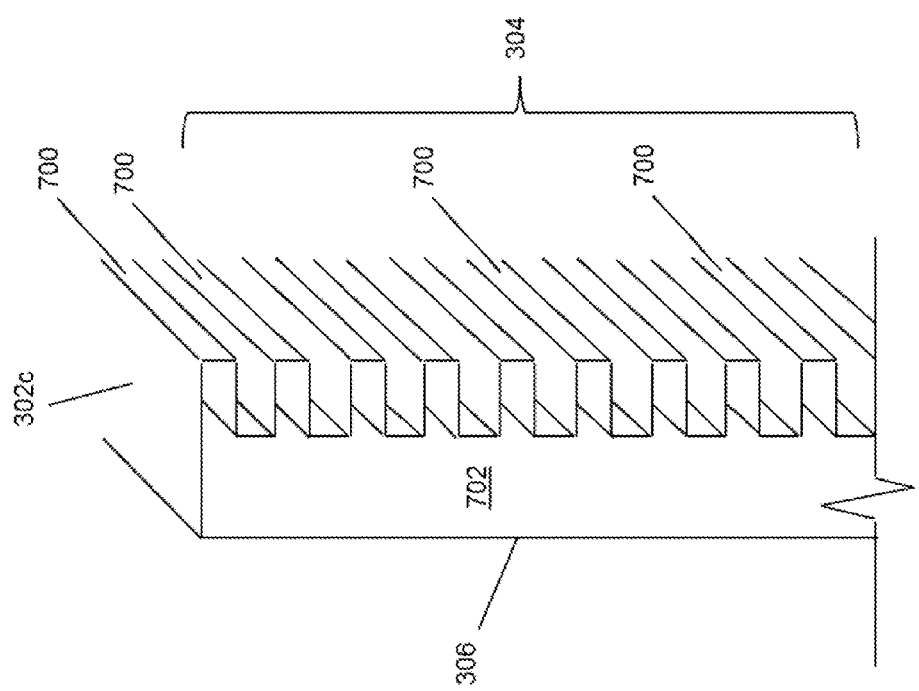
FIG. 7 is a cut-away view illustrating an embodiment of the chassis wall of FIG. 3.

Referring now to FIG. 6, an embodiment of the chassis wall 300 of FIG. 3 is illustrated. In the illustrated embodiment, the chassis wall 300 includes a liquid moving system 600 that is included on the chassis wall 300 and coupled to the cooling section 308a of the liquid cooling channel 308 and the return section 308b of the liquid cooling channel 308. In different embodiments, the liquid moving system 600 may include a pump, a liquid reservoir, and/or other liquid moving components known in the art. In some embodiments, the liquid moving system 600 may be provided within the chassis wall 300 (e.g., between the outer surface 304 and inner surface 306 of the chassis wall 300), while in other embodiments, the liquid moving system 600 may extend from the outer surface 304 and/or the inner surface 306 of the chassis wall 300. Thus, in some embodiments, the chassis wall 300 may provide a closed liquid loop that includes a pump coupled to the liquid cooling channel 308, a liquid included in the liquid cooling channel, and in some cases a liquid reservoir. However, in other embodiments, the chassis wall 300 may include only one of the pump and the liquid reservoir, and may couple to a liquid reservoir or pump that is located in the chassis housing 216 or outside the chassis 200. As discussed below, the chassis wall 300 illustrated in FIG. 6 may be an example of a modular chassis wall that may be coupled to a wall of the chassis 200, and as such may include a variety of attachment and/or coupling features to couple the chassis wall 300 to the chassis 200 (e.g., such that it engages the side wall 214 as discussed below) while remaining within the scope of the present disclosure Referring now to FIG. 7, an embodiment of the chassis wall 300 of FIG. 3 is illustrated. In the embodiments of the chassis wall 300 illustrated and discussed above, the outer surface 304 and the inner surface 306 of the chassis wall 300 are illustrated as substantially smooth, flat surfaces. However, modifications to those surfaces may be provided to enhance heat transfer to and/or from the chassis wall 300. In the embodiment illustrated in FIG. 7, the chassis wall 300 includes a plurality of heat transfer members 700 that extend from the chassis wall 300 to provide the outer surface 304. For example, the heat transfer members 700 may be provided by a plurality of 5 millimeter thick fins separated from each other by 5 millimeters. However, different heat transfer member structures, sizes, and spacing will fall within the scope of the present disclosure as well. In the illustrated embodiment, a liquid cooling channel 702 replaces the liquid cooling channel 308 and is defined between the outer surface 304 of the chassis wall 300 provided by the heat transfer members 700 and the inner surface 306 of the chassis wall 300. In other words, the embodiment illustrated in FIG. 7 provides an example of a "hollow" chassis wall that is configured to allow liquid to move through the liquid cooling channel 702 that is provided by a hollow cavity between the outer surface 304 and inner surface 306 rather than a routed channel such as the liquid cooling channel 308 discussed above. Such hollow chassis wall embodiments may be provided using the polymer and polymer based materials discussed above. However, in other embodiments, the liquid cooling channel 308 may be provided in the chassis wall 300 illustrated in FIG. 7, and in such embodiments the heat transfer members 700 may be substantially solid (i.e., provided by a material that does not define a cavity within the heat transfer member 700 as illustrated in FIG. 7).

Figure 8:
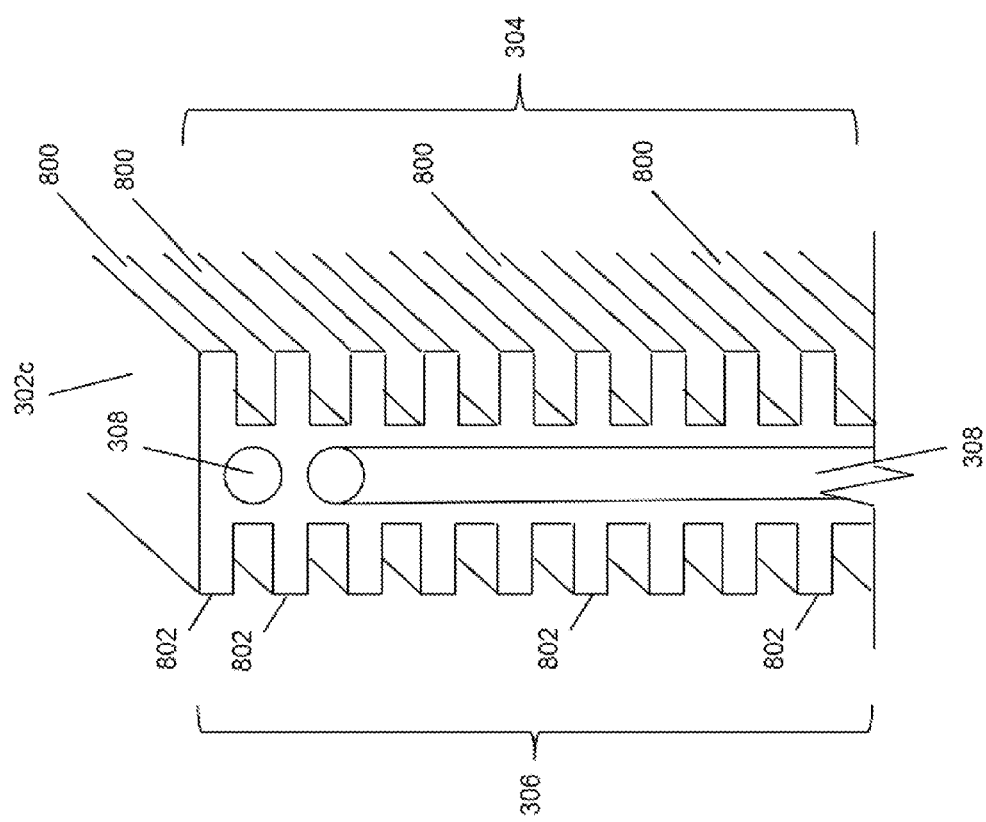
FIG. 8 is a cut-away view illustrating an embodiment of the chassis wall of FIG. 3.
Figure 9:
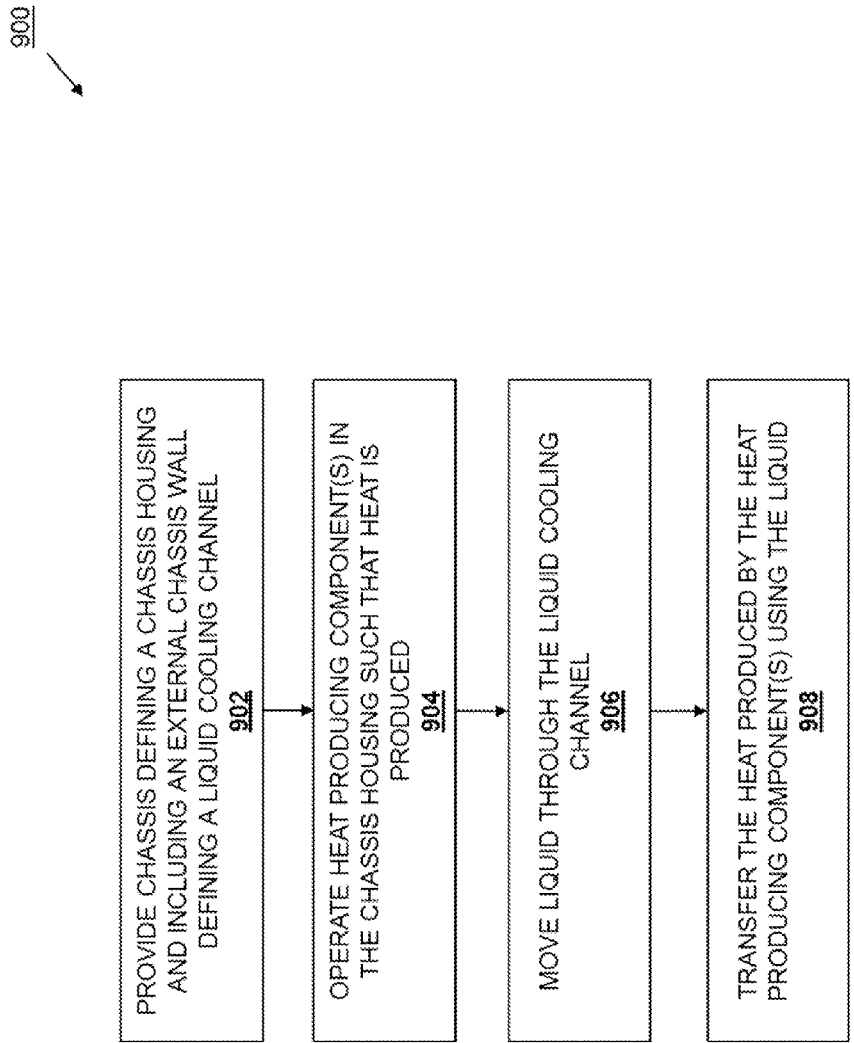
FIG. 9 is a flow chart illustrating an embodiment of a method for providing liquid cooling using an external chassis wall.

Referring now to FIG. 8, an embodiment of the chassis wall 300 of FIG. 3 is illustrated. In the illustrated embodiment, the chassis wall 300 includes a plurality of heat transfer members 800 that extend from the chassis wall 300 to provide the outer surface 304, and a plurality of heat transfer members 802 that extend from the chassis wall 300 to provide the inner surface 306. In the illustrated embodiment, the plurality of heat transfer members 800 and the plurality of heat transfer members 802 are solid heat transfer members that are located on opposing sides of the liquid cooling channel 308. However, as discussed above with regard to the embodiment of the chassis wall 300 illustrated in FIG. 7, the liquid cooling channel 308 may be replaced with a "hollow" chassis wall that is configured to allow liquid to move through a liquid cooling channel that is provided by a hollow cavity between the outer surface 304 and inner surface 306 rather than the routed liquid cooling channel 308. As discussed above, the liquid cooling channel 308/heat transfer member structure illustrated in FIG. 8 may be provided in the chassis wall 300 including the heat transfer members 700 illustrated in FIG. 7. Furthermore, while a structure of the heat transfer members 700, 800, and 802 has been illustrated and described in FIGS. 7 and 8 as "fins", one of skill in the art in possession of the present disclosure will recognize that a variety of other heat transfer member structures will fall within the scope of the present disclosure Referring now to FIG. 9, and embodiment of a method 900 for providing liquid cooling using an external chassis wall is illustrated. As discussed below, the method 900 provides the dissipation of heat produced by heat producing components housed in a chassis using, at least in part, an external chassis wall liquid cooling system that is configured to transfer the heat produced by those heat producing components to a liquid that is moved through a liquid cooling channel defined by an external chassis wall of the chassis. The movement of that heated liquid through of the external chassis wall of the chassis utilizes a previously unused, large volume and surface area that provides for the cooling of that liquid such that the heat is ejected from the chassis to the ambient air and that liquid may again be circulated through the liquid cooling channel to continuously transfer heat produced by the heat producing components to the ambient air outside the chassis via the chassis wall. As will be appreciated by one of skill in the art in possession of the present disclosure, the use of the external chassis wall(s) of the chassis with the disclosed liquid cooling systems provides for substantial increases in the ability to eject heat from the chassis and to the ambient air relative to conventional liquid cooling systems.

The method 900 begins at block 902 where a chassis defining a chassis housing and including an external chassis wall defining a liquid cooling channel is provided. In different embodiments, the provisioning of the chassis with the external chassis wall that defines the liquid cooling channel may be performed in a variety of different ways. While a few of those embodiments are illustrated and discussed below, one of skill in the art in possession of the present disclosure will recognize that different combinations and configurations of the chassis and chassis wall other than those specifically illustrated and described below will fall within the scope of the present disclosure. Referring to FIG. 10, an external chassis wall liquid cooling system 1000 is illustrated that includes the chassis 200 with the components in the chassis housing 216 (discussed above with reference to FIG. 2B) not illustrated for clarity. In the illustrated embodiment, the side wall 214 includes the features of the chassis walls 300 illustrated in FIGS. 3A, 3B, 3C, 4, 7, and/or 8, and specifically has the inlet 400 and the outlet 402 discussed above with reference to FIG. 4 coupled to a liquid moving system 1002 that is located in the chassis housing 216. In different embodiments, the liquid moving system 1002 may include a pump, a liquid reservoir, and/or other liquid moving components known in the art. The external chassis wall liquid cooling system 1000 provides an example of a chassis 200 with an integrated chassis wall 214 that defines a liquid cooling channel (e.g., the liquid cooling channels 308 and 310 discussed above) that is coupled to a liquid moving system that is separate from the chassis wall 214 and housed in the chassis housing 216. In the embodiment illustrated in FIG. 10, a liquid may be provided in the liquid moving system 1002 and the liquid cooling channel in the chassis wall 214 to provide a closed loop liquid cooling system. Furthermore, while not illustrated, the liquid moving system 1002 and the liquid cooling channel in the chassis wall 214 may be coupled to one or more liquid cooling conduits that extend through the chassis housing 216 and adjacent one or more components located in the chassis housing 216 such that the closed loop liquid cooling system is configured to move the liquid adjacent components within the chassis housing 216 as well as adjacent component that engage the chassis wall 214.

Referring to FIG. 11, an external chassis wall liquid cooling system 1100 is illustrated that includes the chassis 200 with the components in the chassis housing 216 (discussed above with reference to FIG. 2B) not illustrated for clarity. In the illustrated embodiment, the chassis wall 300 that includes features illustrated in FIGS. 6 and/or 7 is coupled to the side wall 214 of the chassis 200 such that the inner surface 306 of the chassis wall 306 engages the side outer surface 214a of the side wall 214. In some embodiments, a thermal paste or other heat transfer substrate may be provided between the side wall 214 and the chassis wall 300 to enhance heat transfer between the two. As illustrated, the chassis wall 300 includes the liquid moving system 600 that is integrated with the chassis wall 300. As discussed above, the liquid moving system 600 may include a pump, a liquid reservoir, and/or other liquid moving components known in the art. The external chassis wall liquid cooling system 1100 provides an example of a modular chassis wall 300 that defines a liquid cooling channel (e.g., the liquid cooling channels 308 and 310 discussed above), includes an integrated liquid moving system 600 that is housed in the chassis wall 300, and that is coupled to the existing side panel (i.e., the side wall 214) of the chassis 200 (e.g., using the attachment features discussed above). However, any of the other embodiments of the chassis walls 300 discussed herein may be provided as modular chassis walls similarly as illustrated in FIG. 11 (but while possibly being coupled to liquid moving systems housed in or located outside of the chassis 200) while remaining within the scope of the present disclosure. In the embodiment illustrated in FIG. 11, a liquid may be provided in the liquid moving system 600 and the liquid cooling channel in the chassis wall 300 to provide a closed loop liquid cooling system. Furthermore, while not illustrated, the liquid moving system 600 and the liquid cooling channel in the chassis wall 300 may also be coupled to one or more liquid cooling conduits that extend through the chassis housing 216 and adjacent one or more components located in the chassis housing 216 such that the closed loop liquid cooling system is configured to move the liquid adjacent components within the chassis housing 216 as well as adjacent component that engage the chassis wall 214.

Referring to FIG. 12, an external chassis wall liquid cooling system 1200 is illustrated that includes the chassis 200 with the components in the chassis housing 216 (discussed above with reference to FIG. 2B) not illustrated for clarity. In the illustrated embodiment, each of the top wall 204, the bottom wall 206, the side wall 212, and the side wall 214 (as well as the front wall 208 and/or the back wall 210 in some embodiments) includes the features of the chassis walls 300 illustrated in FIGS. 3A, 3B, 3C, 4, 5, 7, and/or 8, and specifically has the inlet 400 and the outlet 402 discussed above with reference to FIG. 4 coupled to a liquid moving system 1202 that is located in the chassis housing 216, as well as inlets 500 and outlets 502 (not illustrated) coupled to each other to extend the liquid cooling channels 308 through each of the top wall 204, the bottom wall 206, the side wall 212, and the side wall 214 (as well as the front wall 208 and/or the back wall 210 in some embodiments). In different embodiments, the liquid moving system 1202 may include a pump, a liquid reservoir, and/or other liquid moving components known in the art. The external chassis wall liquid cooling system 1200 provides an example of a chassis 200 with integrated chassis walls 204, 206, 212, and 214 that define a liquid cooling channel (e.g., the liquid cooling channels 308 and 310 discussed above) that extend through each of those walls 204, 206, 212, and 214 and that are coupled to a liquid moving system that is separate from the chassis wall 214 and housed in the chassis housing 216. In the embodiment illustrated in FIG. 12, a liquid may be provided in the liquid moving system 1202 and the liquid cooling channel in the chassis walls 204, 206, 212, and 214 to provide a closed loop liquid cooling system. Furthermore, while not illustrated, the liquid moving system 1202 and the liquid cooling channel in the chassis walls 204, 206, 212, and 214 may be coupled to one or more liquid cooling conduits that extend through the chassis housing 216 and adjacent one or more components located in the chassis housing 216 such that the closed loop liquid cooling system is configured to move the liquid adjacent components within the chassis housing 216 as well as adjacent component that engage the chassis walls 204, 206, 212, and 214.

As discussed above, while a few specific examples of external chassis wall liquid cooling systems are illustrated, a wide variety of different feature combinations and variations may be provided while remaining within the scope of the present disclosure. For example, the chassis 200 may include an integrated chassis wall that defines a liquid cooling channel and also houses the liquid moving system (rather than couple to a liquid moving system located in the chassis housing 216). Furthermore, in some embodiments, liquid moving systems coupled to the liquid cooling channel in the chassis wall may be housed outside the chassis 200. Further still, combinations of the chassis walls 300 illustrated in FIGS. 3B and 3C may be provided in the external chassis wall liquid cooling system 1200 illustrated in FIG. 12, and any of the external chassis wall liquid cooling systems may include heat transfer members such as those illustrated in FIGS. 7 and 8. As such, the present disclosure should not be limited to the specific embodiments illustrated and described herein, as any of the features discussed above may be provided with other features discussed above to provide particular benefits for a given system that will optimize the liquid cooling of that system while remaining within the scope of the present disclosure.

The method 900 then proceeds to block 904 where heat producing component(s) in the chassis housing are operated such that heat is produced. In an embodiment, any of the components in the chassis 200 such as, for example, the circuit board 218, the processor 220, the plurality of memory devices 222, the plurality of subsystem cards 224, the heat dissipation device 226, the plurality of storage devices 228, and/or other components known in the art may be operated to perform any of a variety of computing functions known in the art and, in response, will produce varying levels of heat. Furthermore, while not required in some embodiments (i.e., when the external chassis wall liquid cooling system is the sole cooling system provided with the chassis 200), the fan 230, the fan 232, and/or other conventional cooling subsystems may be operated to move air through the chassis housing 216 and/or past the components in order to transfer the heat produced from those components to that air (e.g., through the heat dissipation device 226 to transfer heat produced by the processor 220).

The method 900 then proceeds to block 906 where liquid is moved through the liquid cooling channel. In an embodiment, at block 906, the liquid moving system (e.g., the liquid moving systems 600, 1002, or 1202) may operate (e.g., via a pump in the liquid moving system) to move the liquid in the external chassis wall liquid cooling systems through the liquid cooling channel (e.g., the liquid cooling channels 308 and/or 310) such that the liquid is circulated through the liquid cooling channel. As such, the liquid may be moved through the cooling section 308a and a return section 308b of the liquid cooling channel 308 in the chassis wall 300 illustrated in FIG. 3B, through the supply section 310a, the cooling section 310b, and the return section 310c of the liquid cooling channel 310 in the chassis wall 300 illustrated in FIG. 3C, and/or otherwise throughout the chassis wall 300. As discussed above, in some embodiments, the liquid moving system may circulate the liquid only through the chassis wall 300. However, in other embodiment, the liquid cooling system may circulate the liquid through a plurality of the chassis walls 300 (i.e., as illustrated in FIG. 12). Furthermore, in some embodiments, the liquid circulated through the chassis wall 300 may be further circulated through liquid conduits that extend into the chassis housing 216 and adjacent components such that the liquid moves through the liquid conduits in the chassis housing 216, through the chassis wall 300, back through the liquid conduits, and so on. Similarly, the liquid may be circulated through internal heat rejection devices located in the chassis housing 216 such as fluid-to-air heat exchangers and/or other heat rejection devices known in the art while remaining within the scope of the present disclosure. In some embodiments, the movement of the liquid through the liquid cooling channel may be performed whenever the components in the chassis housing 216 are operating to produce heat. However, in other embodiments, the liquid moving system may be triggered to move the liquid through the liquid cooling channel at block 906. For example, one or more predetermined temperatures (e.g., of specific components, an average of a group of components, of a sensor in the chassis housing 216, etc.) may be determined and used to activate the liquid moving system (e.g., via a controller provided by the processing system) such that the liquid is moved through the liquid cooling channel when a component, a group of components, the chassis housing 216, or some other system feature reaches the predetermined temperature that is indicative of a need for liquid cooling.

The method 900 then proceeds to block 908 where heat produced by the heat producing component(s) is transferred using the liquid. In an embodiment, as the liquid moves through the liquid cooling channel 308 in the chassis wall 214/300, the heat produced by the heat producing components in the chassis housing 216 that is transferred to the liquid is then transferred to the ambient air adjacent the outer surface 304/side outer surface 214c of the chassis wall 214/300. For example, the liquid in the liquid cooling channel 308/310 may move past a component located adjacent the chassis wall 214/300 (e.g., the processor 220 in FIG. 2B), and the heat produced by the component will be transferred through the chassis wall 214/300 and to the liquid. That heated liquid will then continue to move through the liquid cooling channel 308/310 in the chassis wall 21/300 and, as it does, heat will be transferred from the liquid and through the chassis wall 214/300 to the ambient air adjacent the side outer surface 214c/outer surface 304 of the chassis wall 214/300.

In another example, the fans 230 and/or 232 may be operated to move air through the chassis housing 216 and past components (e.g., the heat dissipation device 226 and the processor 220 in FIG. 2B), and the heat produced by the component will be transferred to that air. That heated air will then engage the chassis wall 214/300 and the heat in that air will be transferred through the chassis wall 214/300 to the liquid. That heated liquid will then move through the liquid cooling channel 308/310 in the chassis wall 21/300 and, as it does, heat will be transferred from the liquid and through the chassis wall 214/300 to the ambient air adjacent the side outer surface 214c/outer surface 304 of the chassis wall 214/300. In another example, the liquid may move through liquid conduits that extend through the chassis housing 216 and past components located in the chassis housing 216 (e.g., the processor 220 in FIG. 2B), and the heat produced by the component will be transferred through the liquid conduit and to the liquid. That heated liquid will then move through the liquid cooling channel 308/310 in the chassis wall 21/300 and, as it does, heat will be transferred from the liquid and through the chassis wall 214/300 to the ambient air adjacent the side outer surface 214c/outer surface 304 of the chassis wall 214/300.

In some embodiments, the heat transfer members 700 and/or 800/802 illustrated in FIGS. 7 and 8 may be utilized on the chassis wall 214/300 to provide the heat transfer at block 908. For example, the heat transfer members 802 that provide the inner surface 306 of the chassis wall 300 in FIG. 8 may be utilized with the fans 230 and 232 discussed above, to transfer heat from heated air provided by the fans and the heat producing components to the liquid in the liquid cooling channel 308, and the heat transfer members 800 that provide the outer surface 304 of the chassis wall 300 in FIG. 8 may be utilized to transfer the heat from the liquid in the liquid cooling channel 308 to the ambient air adjacent the outer surface 304 of the chassis wall 300. In another example, the heat transfer members 700 that provide the outer surface 304 of the chassis wall 300 in FIG. 8 may be utilized to transfer the heat from the liquid in the liquid cooling channel 702 to the ambient air adjacent the outer surface 304 of the chassis wall 300.

Thus, system and methods have been described that provide for the use of an external wall on a chassis to transfer heat produced by heat producing components housed in that chassis by providing liquid cooling channels in that external chassis wall and moving liquid through the liquid cooling channels to dissipate heat produced by those heat producing components to the ambient air outside of the chassis. The liquid in the liquid cooling channel may operate in conjunction with air moving systems, liquid conduits extending into and through the chassis housing, heat transfer members extending from the chassis walls, and/or other heat transfer subsystems to transfer the heat produced by the heat producing components to the liquid, while pumps, liquid reservoirs, and/or other liquid cooling subsystems may be utilized to move that liquid through the liquid cooling channels such that the heat may be dissipated to the ambient air. The use of external wall(s) of the chassis to dissipate heat from heat producing components housed in the chassis provides for the use of large and previously unutilized and undervalued surfaces to dissipate heat that greatly increases the heat dissipation capacity of liquid cooling systems relative to conventional liquid cooling systems (e.g., due to the relatively significant surface area being used to dissipate the heat). For example, experimental embodiments have found that a single, smooth external chassis wall utilizing the teachings of the present disclosure can provide an increase in cooling capacity of approximately 150 watts, while an single, external chassis wall with a 5 millimeter fin-enhanced outer surface (e.g., the heat transfer members illustrated in FIGS. 7 and 8) can provide an increase in cooling capacity of approximately 320 watts. As such, utilization of the chassis wall of the present disclosure with the high powered desktop computing systems discussed above that produce upward of 1000 watts of heat allows for ⅓ of the system heat may be dissipated from the chassis with little to no acoustic burden or need to increase the size of the chassis.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An external chassis wall liquid cooling system, comprising:
    a chassis defining a chassis housing;
    a chassis wall that is located on the chassis and that includes a first surface that is located adjacent the chassis housing and a second surface that is located opposite the chassis wall from the first surface and that provides an outer surface of the chassis;
    a liquid cooling channel defined by the chassis wall and extending through the chassis wall between the first surface and the second surface;
    a liquid located in the liquid cooling channel; and
    a pump coupled to the liquid cooling channel and configured to move the liquid through the liquid cooling channel.

2. The chassis wall liquid cooling system of claim 1, wherein the chassis wall is coupled to the chassis such that the first surface of the chassis wall engages a third surface on the chassis.

3. The chassis wall liquid cooling system of claim 1, wherein the first surface of the chassis wall provides an inner surface of the chassis that is located immediately adjacent the chassis housing such that the first surface defines a portion of the chassis housing.

4. The chassis wall liquid cooling system of claim 1, further comprising:
    a plurality of heat transfer members that extend from the chassis wall to provide the second surface of the chassis wall.

5. The chassis wall liquid cooling system of claim 1, further comprising:
    a plurality of heat transfer members that extend from the chassis wall to provide the first surface of the chassis wall.

6. The chassis wall liquid cooling system of claim 1, wherein the pump is housed in the chassis wall.

7. An information handling system (IHS), comprising:
    a chassis defining a chassis housing;
    a processing system located in the chassis housing;
    a memory system located in the chassis housing and coupled to the processing system;
    a fan located in the chassis housing and configured to provide an airflow through the chassis housing and adjacent the processing system;
    a chassis wall located on the chassis and including a first surface that is located adjacent the chassis housing and a second surface that is located opposite the chassis wall from the first surface and that provides an outer surface of the chassis; and
    a liquid cooling channel defined by the chassis wall and extending through the chassis wall between the first surface and the second surface.

8. The IHS of claim 7, wherein the chassis wall is coupled to the chassis such that the first surface of the chassis wall engages a third surface on the chassis.

9. The IHS of claim 7, wherein the first surface of the chassis wall provides an inner surface of the chassis that is located immediately adjacent the chassis housing such that the first surface defines a portion of the chassis housing.

10. The IHS of claim 7, further comprising:
    a plurality of heat transfer members that extend from the chassis wall to provide the second surface of the chassis wall.

11. The IHS of claim 7, further comprising:
    a plurality of heat transfer members that extend from the chassis wall to provide the first surface of the chassis wall.

12. The IHS of claim 7, further comprising:
    a pump coupled to the liquid cooling channel and configured to move a liquid through the liquid cooling channel.

13. The IHS of claim 12, wherein the pump is housed in the chassis wall.

14. A method for providing liquid cooling using an external chassis wall, comprising:
    providing a chassis that defines a chassis housing and includes a chassis wall having a first surface that is located adjacent the chassis housing, and having a second surface that is located opposite the chassis wall from the first surface and that provides an outer surface of the chassis;
    operating at least one heat producing component that is positioned in the chassis housing such that heat is produced;
    moving a liquid though a liquid cooling channel that is defined by the chassis wall and that extends through the chassis wall between the first surface and the second surface; and
    transferring the heat produced by the operation of the at least one heat producing component out of the chassis using the liquid.

15. The method of claim 14, further comprising:
coupling the chassis wall to the chassis such that the first surface of the chassis wall engages a third surface on the chassis.

16. The method of claim 14, wherein the first surface of the chassis wall provides an inner surface of the chassis that is located immediately adjacent the chassis housing such that the first surface defines a portion of the chassis housing.

17. The method of claim 14, wherein the chassis wall includes a plurality of heat transfer members that extend from the chassis wall to provide the second surface of the chassis wall.

18. The method of claim 14, where the chassis wall includes a plurality of heat transfer members that extend from the chassis wall to provide the first surface of the chassis wall.

19. The method of claim 14, wherein the moving the liquid through the liquid cooling channel is performed by a pump that is coupled to the liquid cooling channel.

20. The method of claim 19, wherein the pump is housed in the chassis wall.

\* \* \* \* \*